United States Patent
Ng et al.

(10) Patent No.: US 6,784,460 B2
(45) Date of Patent: Aug. 31, 2004

(54) CHIP SHAPING FOR FLIP-CHIP LIGHT EMITTING DIODE

(75) Inventors: Kee Yean Ng, Prai (MY); Yew Cheong Kuan, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/268,223

(22) Filed: Oct. 10, 2002

(65) Prior Publication Data

US 2004/0070000 A1 Apr. 15, 2004

(51) Int. Cl.$^7$ .............. H01L 29/267; H01L 29/22; H01L 29/227; H01L 29/24
(52) U.S. Cl. ............... 257/95; 257/81; 257/98; 257/99; 257/100
(58) Field of Search .............. 257/80, 81, 82, 257/94, 95, 98, 99, 100, 680

(56) References Cited

U.S. PATENT DOCUMENTS

| | | | | |
|---|---|---|---|---|
| 6,024,455 A | * | 2/2000 | O'Neill et al. | 359/530 |
| 6,323,063 B2 | * | 11/2001 | Krames et al. | 438/116 |
| 6,610,598 B2 | * | 8/2003 | Chen | 438/666 |
| 2002/0153835 A1 | * | 10/2002 | Fujiwara et al. | 313/512 |

\* cited by examiner

*Primary Examiner*—Nathan J. Flynn
*Assistant Examiner*—Victor A. Mandala, Jr.

(57) ABSTRACT

A LED of flip-chip design comprises a light emitting region and one or more transparent substrates overlying the light emitting region. The light emitting region includes a negatively doped layer, a positively doped layer, and an active p-n junction layer between the negatively doped layer and the positively doped layer. At least one of the substrates has a pyramidal shape determined by (1) the composition of electrically conductive or electrically non-conductive material, (2) the number of side surfaces, (3) the degree of offset of an apex or top surface, and (4) the slope angle of each side surface relative to a bottom surface.

8 Claims, 14 Drawing Sheets

US 6,784,460 B2

CHIP SHAPING FOR FLIP-CHIP LIGHT EMITTING DIODE

FIELD OF THE INVENTION

The present invention generally relates to the field of light sources. More specifically, the present invention relates to a method of improving light extraction from a light emitting diode ("LED") of flip-chip design through geometrical shaping of the chip.

DESCRIPTION OF THE RELATED ART

An LED is a semiconductor chip or die that emits light when a forward current flows through the LED. FIG. 1 illustrates a known LED 30 of flip-chip design, where the LED 30 includes a transparent substrate 31 having a cuboidal shape (e.g., a rectangular prism), a negatively doped layer 32, an active p-n junction layer 33, and a positively doped layer 34. A pair of ohmic contacts 35 and 36 are employed to forward bias LED 30 whereby light is generated and emitted from the active p-n junction layer 33 into the substrate 31. Typically, a refractive index of the substrate 31 will be different than a refractive index of the surrounding environment (e.g., air or a medium employed to encapsulate the substrate 31). As illustrated in FIG. 2, such a difference in the refractive indices establishes a critical angle that results in a partitioning of the substrate 31 into escape cones 31a, 31c and 31e and total internal reflection cones ("TIRC") 31b and 31d. It is well known in the art that the substrate 31 will emit light from the escape cones 31a, 31c and 31e as exemplified by the arrows therein, because an angle of incidence of the emitted light will be less than the critical angle. Conversely, the substrate 31 will not emit light from the TIRC cones 31b and 31d as exemplified by the arrows therein, because an angle of incidence of the trapped light will be equal to or greater than the critical angle for each internal reflection of the trapped light by the substrate 31.

The present invention advances the art by a contribution of an improved light extraction from a LED of flip-chip design.

SUMMARY OF THE INVENTION

A flip-chip design of a LED is constructed in accordance with various embodiments of the present invention. The LED comprises a light emitting region including a negatively doped layer, a positively doped layer, and an active p-n junction layer between the negatively doped layer and the positively doped layer. The LED further includes a transparent substrate overlying the light emitting region, wherein the transparent substrate has a pyramidal shape determined by (1) the composition of electrically conductive or electrically non-conductive material, (2) the number of side surfaces, (3) the degree of offset of an apex or top surface, and (4) the slope angle of each side surface.

The features and advantages of the present invention will become further apparent from the following detailed description of the presently preferred embodiments, read in conjunction with the accompanying drawings. The detailed description and drawings are merely illustrative of the present invention rather than limiting, the scope of the present invention being defined by the appended claims and equivalents thereof.

The drawings are not to scale, but are enlarged to facilitate a clear understanding of the present invention.

DETAILED DESCRIPTION OF THE EMBODIMENTS

Figure 1:
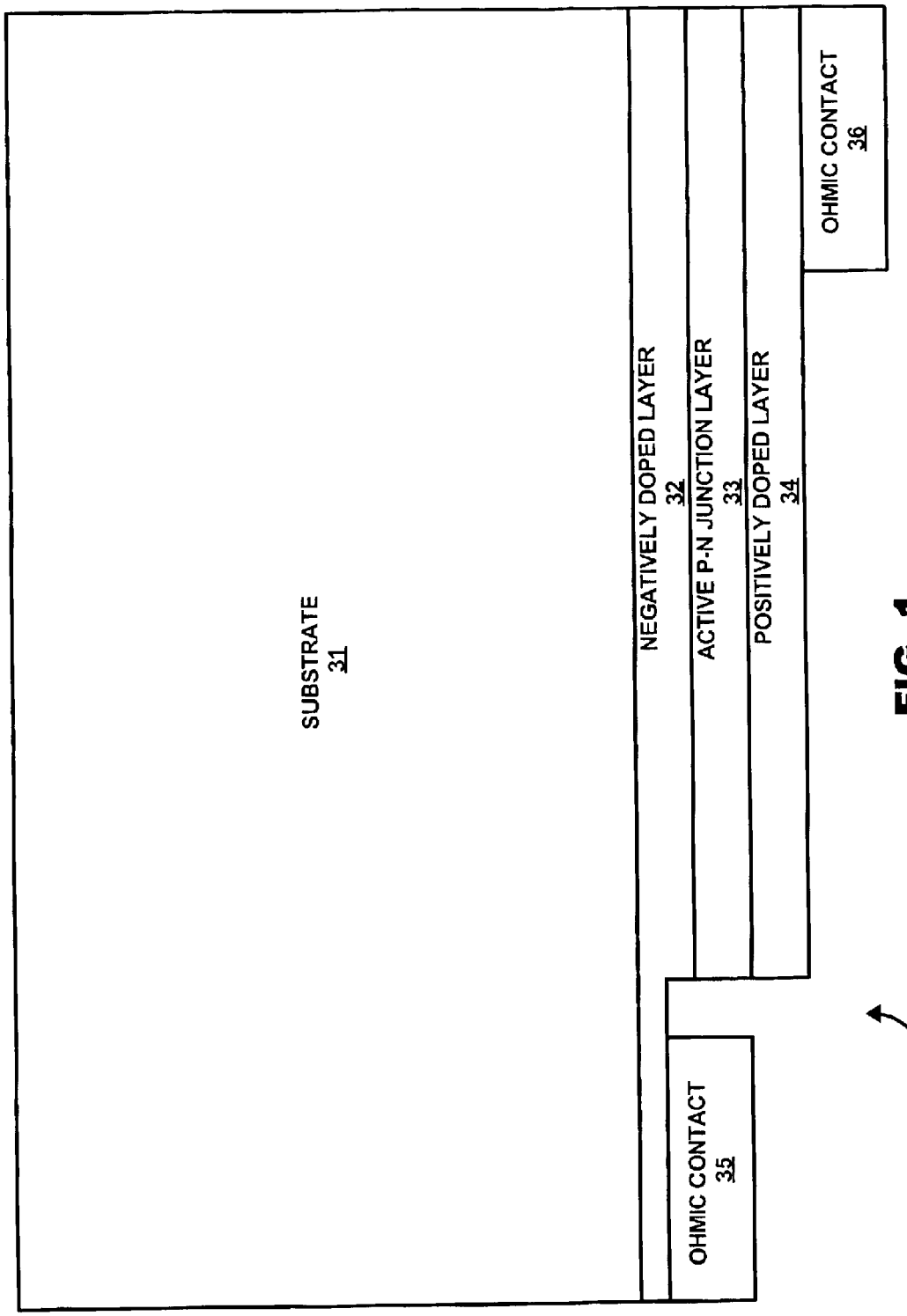
FIG. 1 illustrates a side view of a known LED of flip-chip design.
Figure 2:
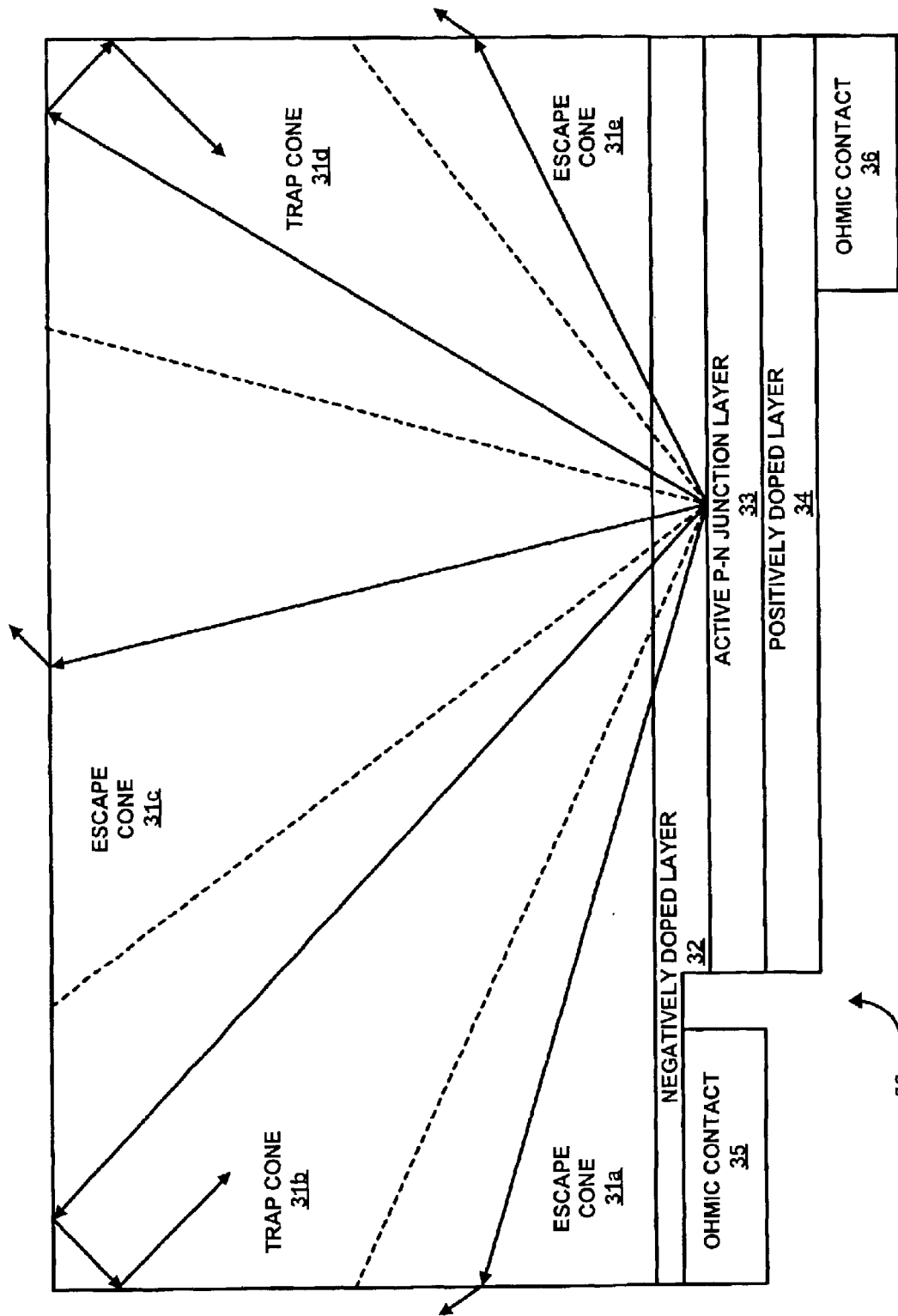
FIG. 2 illustrates a light extraction operation of the LED of FIG. 1.
Figure 3:
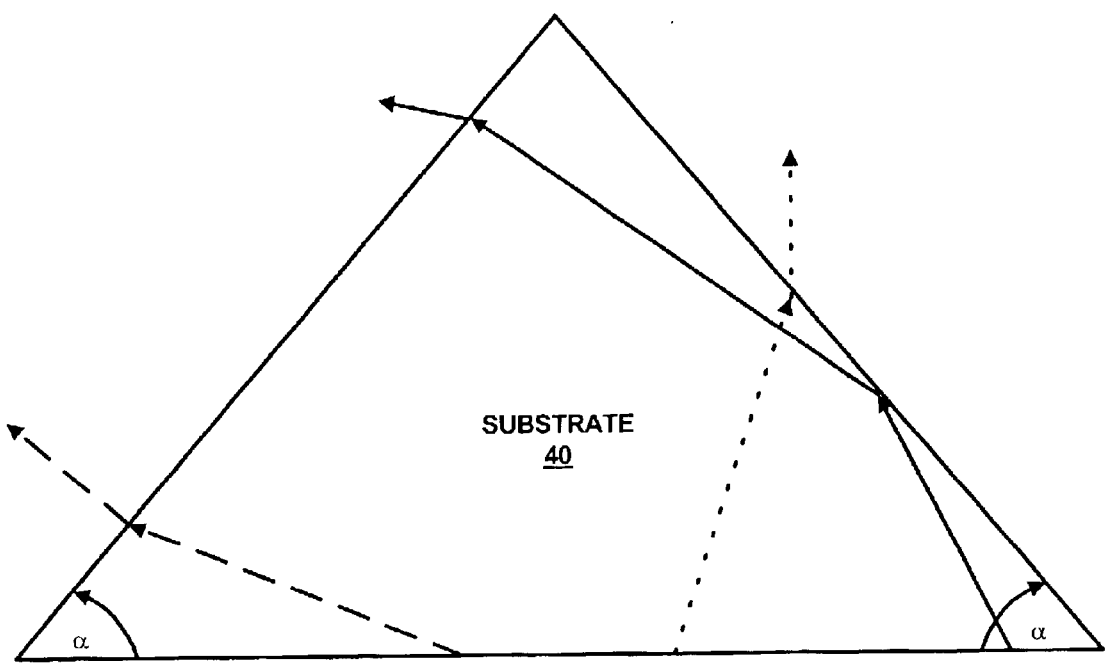
FIG. 3 illustrates a side view of a LED substrate having an apexed pyramidal shape in accordance an embodiment of the present invention.

FIG. 3 illustrates a transparent substrate 40 having an apexed pyramidal shape. Typically, the substrate 40 is fabricated by sawing techniques, dry or wet etching techniques, sandblasting techniques, ion milling, or scribing and breaking techniques. The apexed pyramidal shape of the substrate 40 facilitates an optimal formation of escape cones within the substrate 40. The emitted light exemplified by the dashed arrows has an angle of incidence that is less than the critical angle corresponding to the substrate 40, while the emitted light exemplified by the solid arrows was initially internally reflected due to an initial angle of incidence that equaled or exceeded the critical angle and subsequently emitted from the substrate 40 due to a subsequent angle of incidence that is less than the critical angle.

An employment of the substrate 40 into a flip-chip LED depends on whether the substrate 40 shall be composed of electrically conductive material or electrically non-conductive material. Examples of electrically conductive material suitable for the substrate 40 are compound semiconductors such as, for example, Gallium Phosphide (GaP), Aluminium Gallium Arsenide (AlGaAs), Gallium Nitride (GaN), and Silicon Carbide (SiC). An example of an electrically non-conductive material suitable for the substrate 40 is sapphire.

Figure 4:
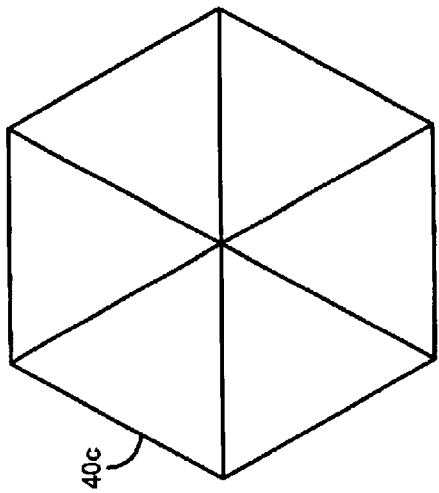
FIGS. 4–8 illustrate plan views of various design considerations of the LED substrate of FIG. 3.
Figure 5:
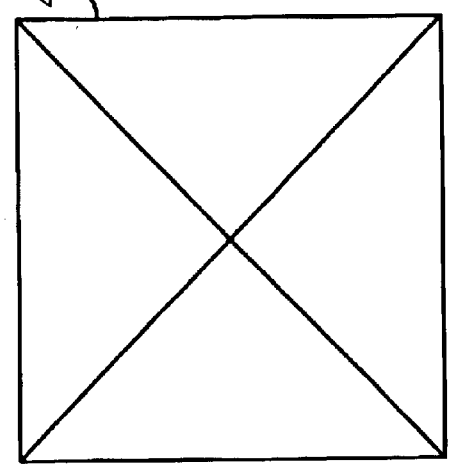
Figure 6:
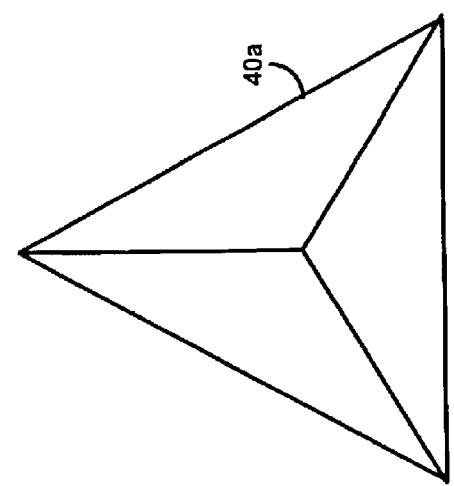

The substrate 40 has at least three (3) side surfaces. FIG. 4 illustrates a substrate 40a having three (3) side surfaces. FIG. 5 illustrates a substrate 40b having four (4) side surfaces. FIG. 6 illustrates a substrate 40c having six (6) side surfaces.

Figure 7:
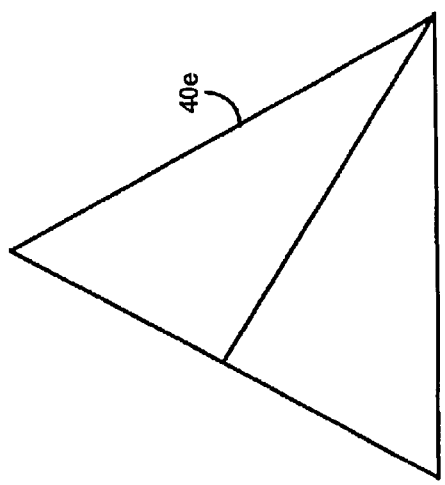
Figure 8:
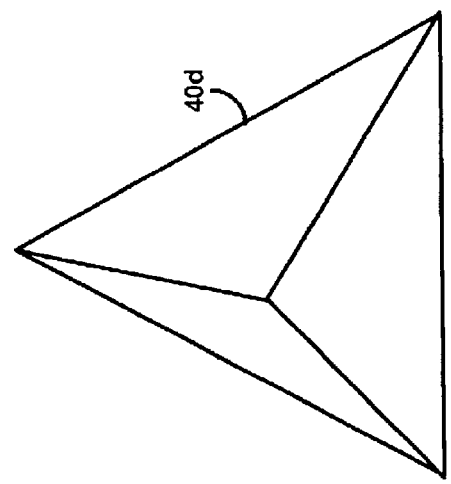

The degree of offset of an apex relative to a longitudinal axis of the substrate 40 ranges from zero (0) to a maximum allowable offset enabled by the dimensions of the substrate 40. FIG. 4 illustrates an offset of zero (0) for substrate 40a (i.e., the apex and a longitudinal axis coincide). FIG. 7 illustrates a median offset for a substrate 40d. FIG. 8 illustrates a maximum offset for a substrate 40e.

The slope angle α (FIG. 3) for each side surface of substrate 40 relative to the bottom surface (not shown) of substrate 40 occupies an optimal slope angle range of 10° to 80° with the selection of the slope angle α depending upon the refractive indices of the material of the substrate 40 and the surrounding environment (e.g., air or a medium encapsulating the substrate 40). However, a selection of the slope angle α outside of the optimal slope angle is alternately used to facilitate an optimal formation of escape cones within the substrate 40.

Figure 9:
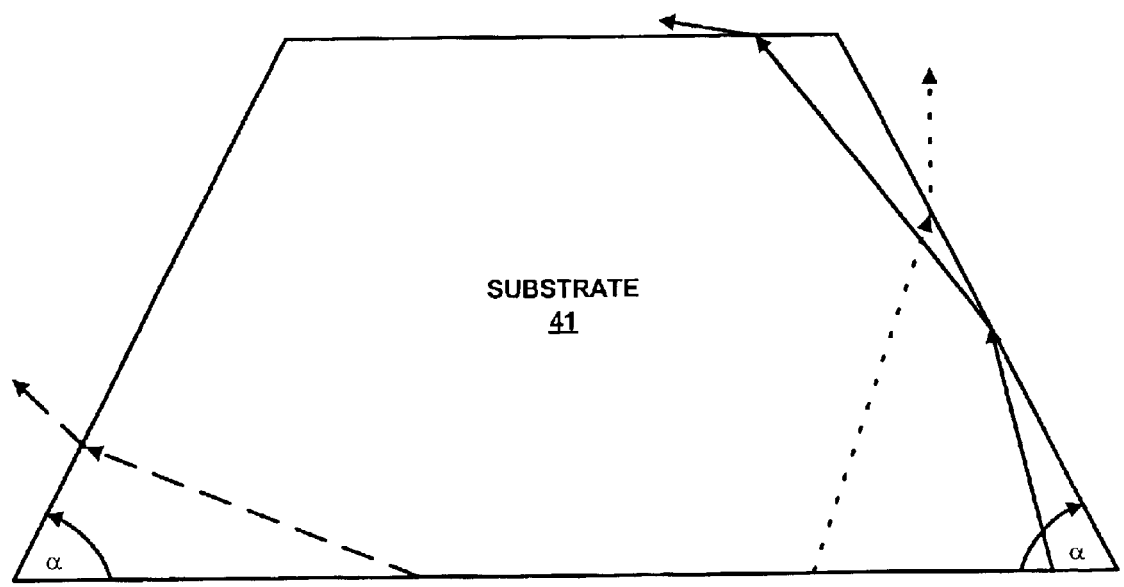
FIG. 9 illustrates a side view of a LED substrate having a truncated pyramidal shape in accordance an alternative embodiment of the present invention.

FIG. 9 illustrates a transparent substrate 41 having a truncated pyramidal shape. Typically, the substrate 41 is fabricated by sawing techniques, dry or wet etching techniques, sandblasting techniques, ion milling, or scribing and breaking techniques. The truncated pyramidal shape of the substrate 41 facilitates an optimal formation of escape cones within the substrate 41. The emitted light exemplified by the dashed arrows indicate the emitted light has an angle of incidence that is less than the critical angle corresponding to the substrate 41, while the emitted light exemplified by the solid arrows indicate the emitted light was initially internally reflected due to an initial angle of incidence that equaled or exceeded the critical angle and subsequently emitted from the substrate 41 due to a subsequent angle of incidence that is less than the critical angle.

An employment of the substrate 41 into a flip-chip LED depends on whether the substrate 41 shall be composed of electrically conductive material or electrically non-conductive material. Examples of electrically conductive material suitable for the substrate 41 are compound semiconductors, such as, for example, GaP, AlGaAs, GaN, and SiC. An example of an electrically non-conductive material suitable for the substrate 41 is sapphire.

Figure 12:
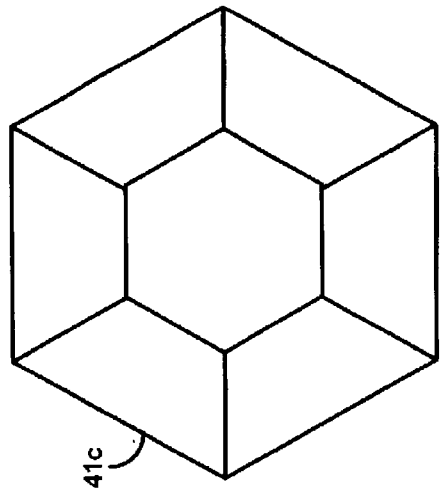
FIGS. 10–14 illustrates plan views of various design considerations of the LED substrate of FIG. 9.
Figure 11:
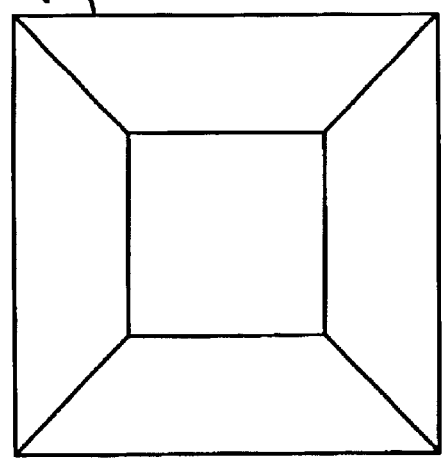
Figure 10:
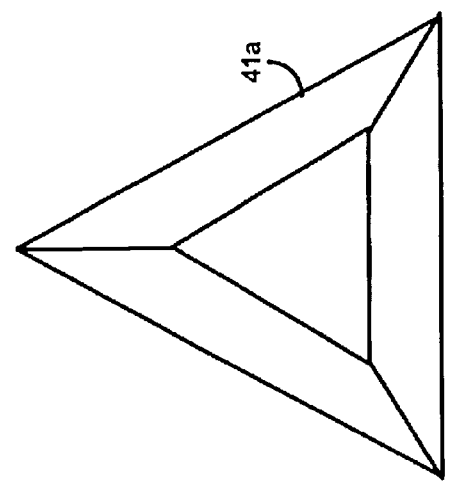

The substrate 41 has at least three (3) side surfaces. FIG. 10 illustrates a substrate 41a having three (3) side surfaces. FIG. 11 illustrates a substrate 41b having four (4) side surfaces. FIG. 12 illustrates a substrate 41c having six (6) side surfaces.

Figure 14:
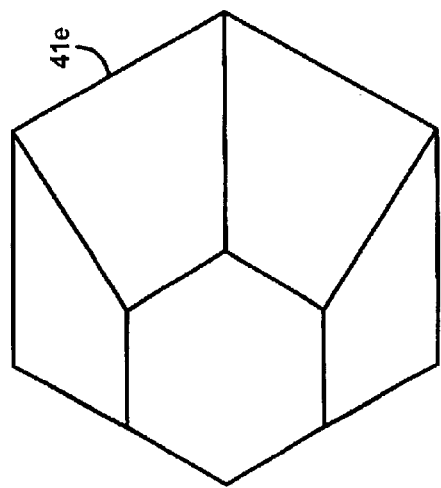
Figure 13:
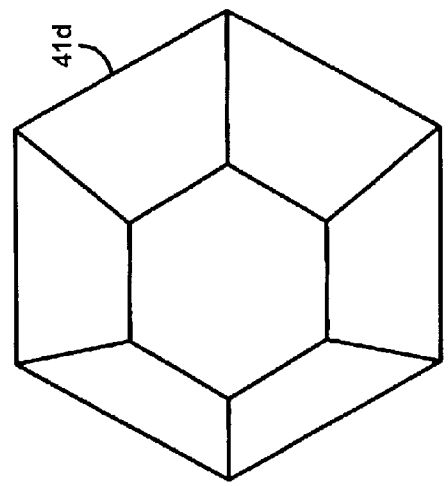

The degree of offset of the top surface of the substrate 41 relative to a longitudinal axis of the substrate 41 ranges from zero (0) to a maximum allowable offset enabled by the dimensions of the substrate 41. FIG. 10 illustrates an offset of zero (0) for the substrate 41a (i.e., the center of top surface and the center longitudinal axis of the substrate 41a coincide). FIG. 13 illustrates a median offset for a substrate 41d. FIG. 14 illustrates a maximum offset for a substrate 41e.

The slope angle α (FIG. 9) for each side surface relative to the bottom surface (not shown) of substrate 41 occupies an optimal slope angle range of 10° to 80° with the selection of the slope angle α depending upon the refractive indices of the material of the substrate 41 and the surrounding environment (e.g., air or a medium encapsulating the substrate 41). However, a selection of the slope angle α outside of the optimal slope angle is alternately used to facilitate an optimal formation of escape cones within the substrate 41.

From the preceding description of the substrate 40 (FIG. 3) and the substrate 41 (FIG. 9), those having ordinary skill in the art will appreciate that the number of configurations for the transparent substrate 40 and the transparent substrate 41 are essentially limitless.

FIGS. 15–23 illustrate nine (9) embodiments of a flip-chip LED of the present invention employing a substrate configured in accordance with the transparent substrate 40 and/or a substrate configured in accordance with the transparent substrate 41. Each illustrated flip-chip LED further employs a light emitting region including a negatively doped layer (e.g., n-type GaP, n-type AlGaAs, n-type GaN, and n-type SiC), an active p-n junction layer (e.g., Aluminium Indium Gallium Phosphide and Indium Gallium Nitride, in either single or multi quantum well structures), a positively doped layer (e.g., p-type GaP, p-type AlGaAs, p-type GaN and p-type SiC), and a pair of ohmic contacts (e.g., various metal layers). While the substrates and the light emitting regions are illustrated in a simplified manner to facilitate a straightforward explanation of an operational relationship between the substrates and the light emitting regions, those having ordinary skill in the art will recognize and understand conventional techniques for composing and fabricating the illustrated flip-chip LEDs of FIGS. 15–23. Those having ordinary skill in the art will further appreciate the interchangeability in the positioning of the negatively doped layers and the positively doped layers within the illustrated light emitting regions.

Figure 15:
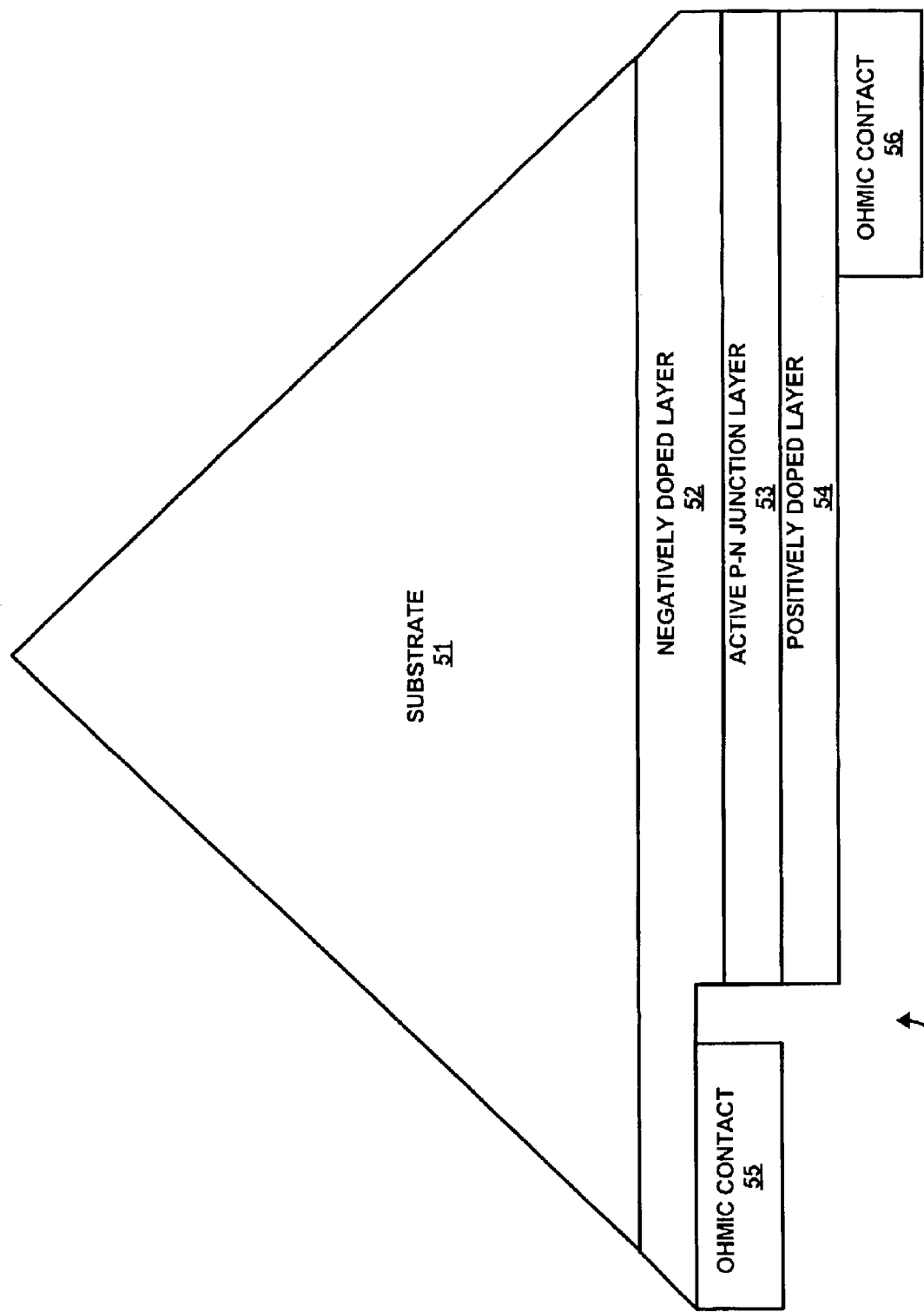
FIGS. 15–23 illustrate side views of nine (9) embodiments of a flip-chip LED in accordance with the present invention.

FIG. 15 illustrates a flip-chip LED 50 including an electrically non-conductive transparent substrate 51, a negatively doped layer 52, an active p-n junction layer 53, and a positively doped layer 54. The substrate 51 has an apexed pyramidal shape with zero (0) degree offset in accordance with substrate 40 (FIG. 3). An upper portion of the negatively doped layer 52 has a truncated pyramidal shape with zero (0) degree offset. A pair of ohmic contacts 55 and 56 are employed to forward bias LED 50 whereby light is generated and emitted from the active p-n junction layer 53 through the substrate 51 into the surrounding environment.

Figure 16:
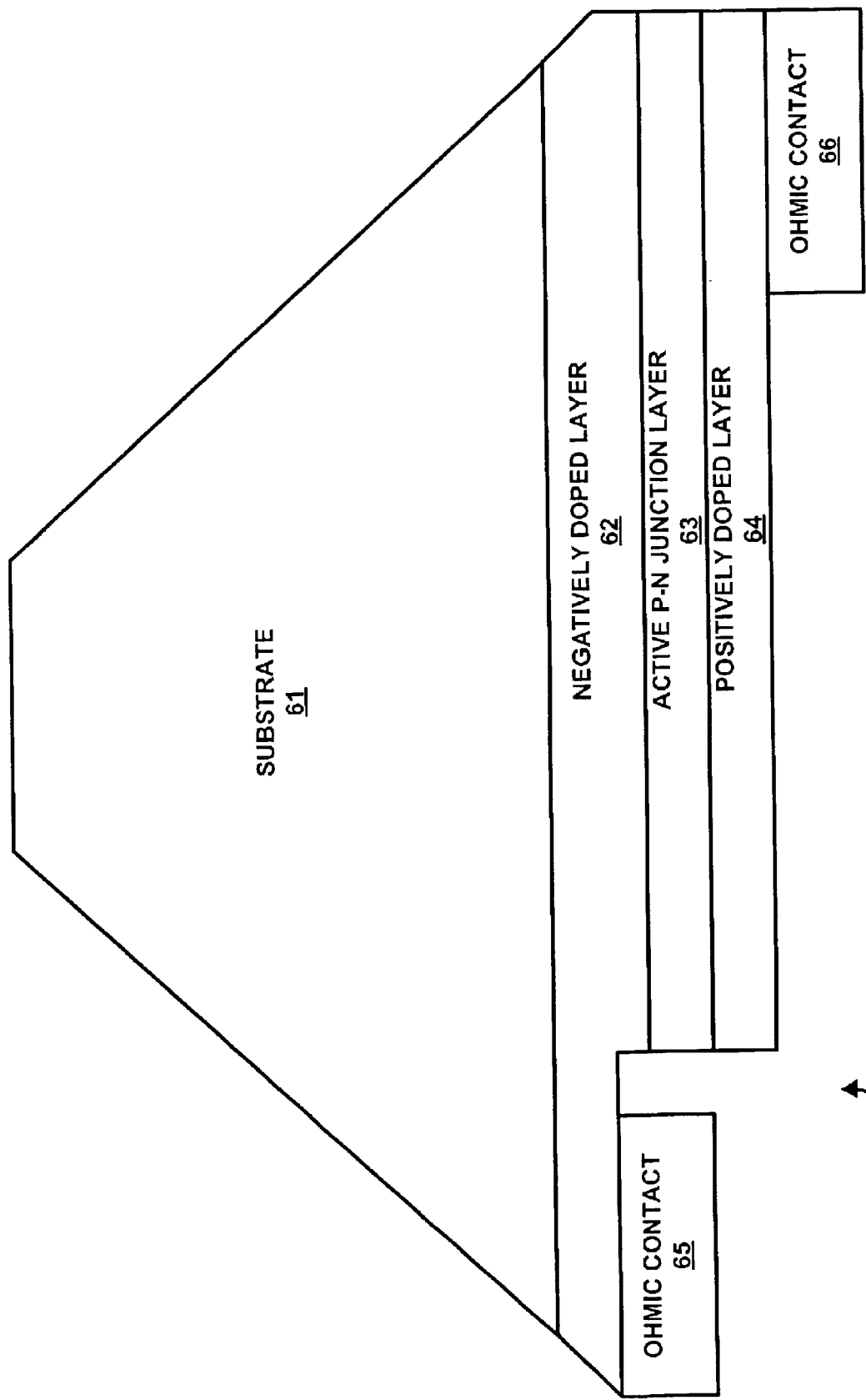

FIG. 16 illustrates a flip-chip LED 60 including an electrically non-conductive transparent substrate 61, a negatively doped layer 62, an active p-n junction layer 63, and a positively doped layer 64. The substrate 61 has a truncated pyramidal shape with zero (0) degree offset in accordance with substrate 41 (FIG. 9). An upper portion of the negatively doped layer 62 has a truncated pyramidal shape with zero (0) degree offset. A pair of ohmic contacts 65 and 66 are employed to forward bias LED 60 whereby light is generated and emitted from the active p-n junction layer 63 through the substrate 61 into the surrounding environment.

Figure 17:
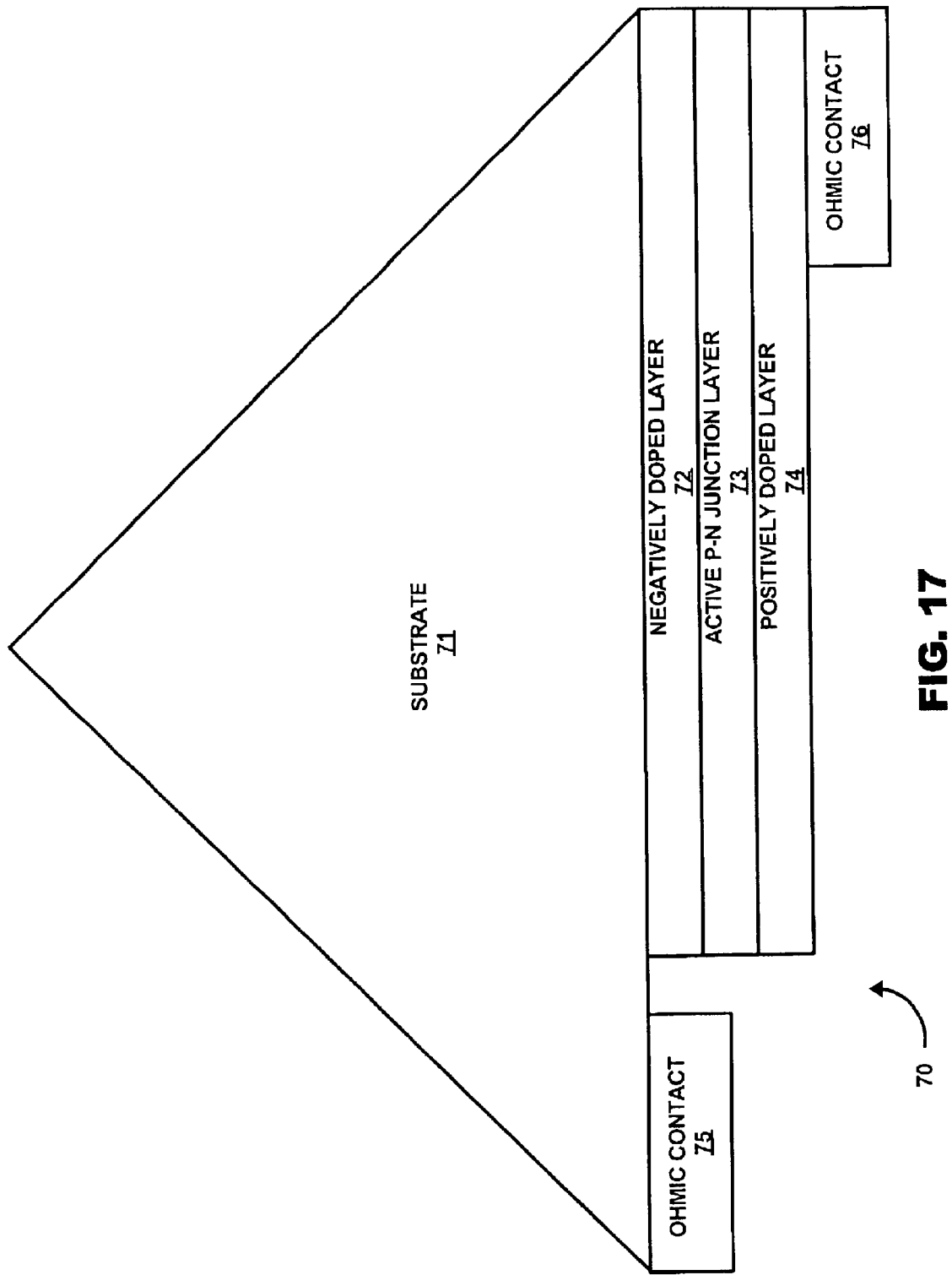

FIG. 17 illustrates a flip-chip LED 70 including an electrically conductive transparent substrate 71, a negatively doped layer 72, an active p-n junction layer 73, and a positively doped layer 74. The substrate 71 has an apexed pyramidal shape with zero (0) degree offset in accordance with substrate 40 (FIG. 3). A pair of ohmic contacts 75 and 76 are employed to forward bias LED 70 whereby light is generated and emitted from the active p-n junction layer 73 through the substrate 71 into the surrounding environment.

Figure 18:
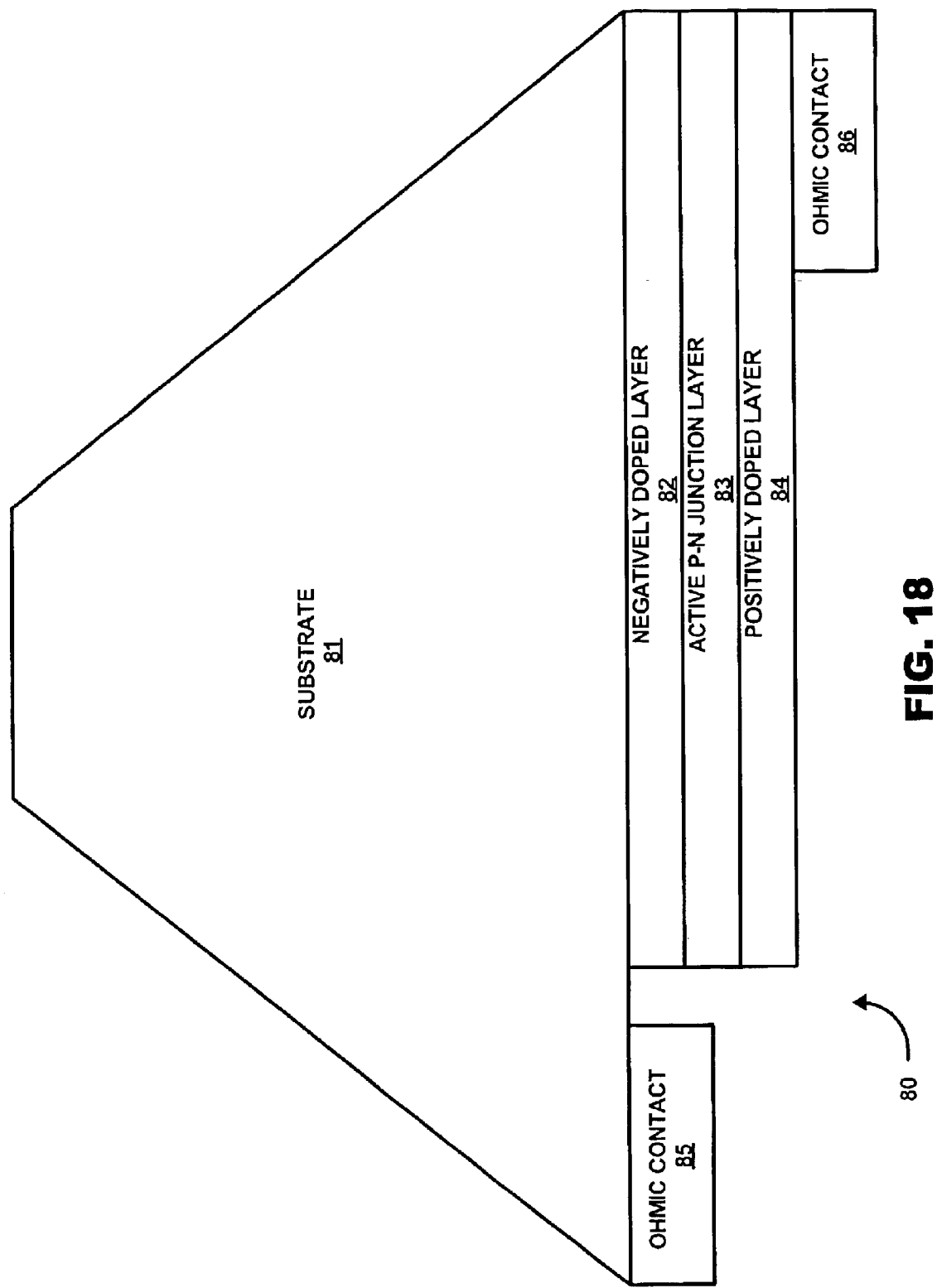

FIG. 18 illustrates a flip-chip LED 80 including an electrically conductive transparent substrate 81, a negatively doped layer 82, an active p-n junction layer 83, and a positively doped layer 84. The substrate 81 has a truncated pyramidal shape with zero (0) degree offset in accordance with substrate 41 (FIG. 9). A pair of ohmic contacts 85 and 86 are employed to forward bias LED 80 whereby light is generated and emitted from the active p-n junction layer 83 through the substrate 81 into the surrounding environment.

Figure 19:
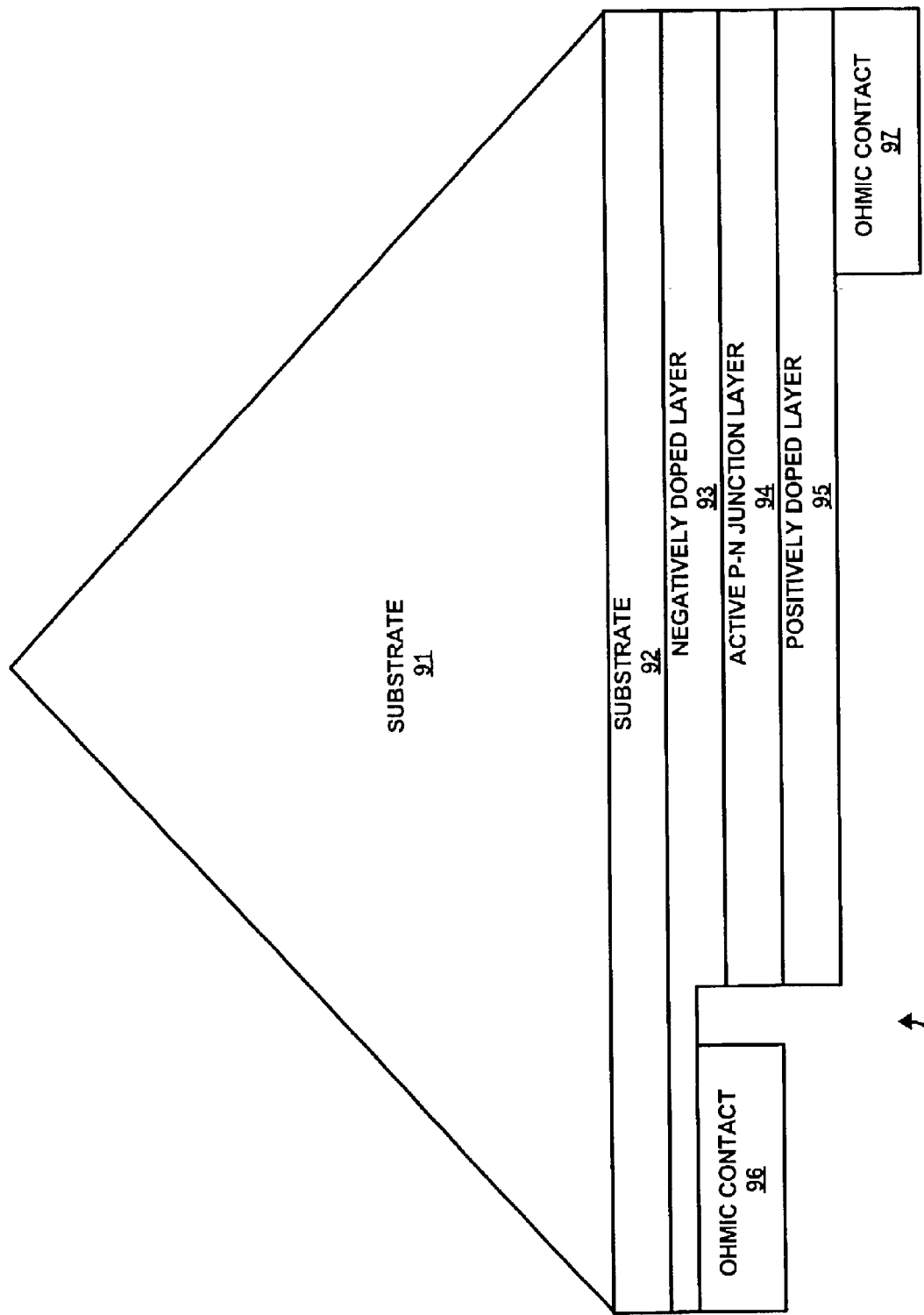

FIG. 19 illustrates a flip-chip LED 90 including an electrically non-conductive transparent substrate 91, an electrically non-conductive transparent substrate 92, a negatively doped layer 93, an active p-n junction layer 94, and a positively doped layer 95. The substrate 91 has an apexed pyramidal shape with a zero (0) degree offset in accordance with substrate 40 (FIG. 3). The substrate 92 has a known cuboidal shape. An optically clear adhesive (not shown) with an refractive index operatively equivalent to the refractive indices of the substrate 91 and the substrate 92 is employed to optically couple substrate 91 to substrate 92. A pair of ohmic contacts 96 and 97 are employed to forward bias LED 90 whereby light is generated and emitted from the active p-n junction layer 94 through the substrates 91 and 92 into the surrounding environment.

Figure 20:
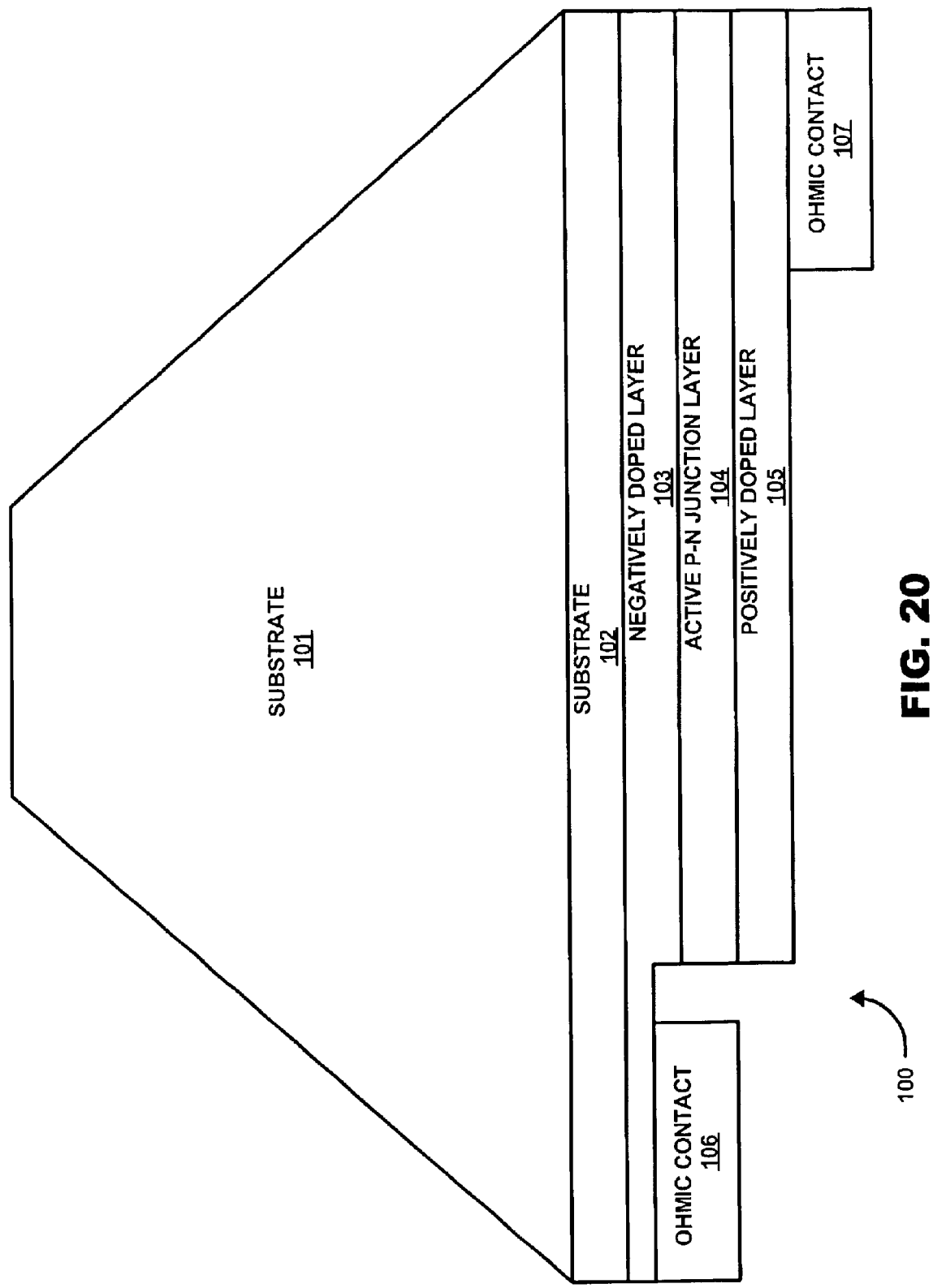

FIG. 20 illustrates a flip-chip LED 100 including an electrically non-conductive transparent substrate 101, an electrically non-conductive transparent substrate 102, a negatively doped layer 103, an active p-n junction layer 104, and a positively doped layer 105. The substrate 101 has a truncated pyramidal shape with a zero (0) degree offset in accordance with substrate 41 (FIG. 9). The substrate 102 has a known cuboidal shape. An optically clear adhesive (not shown) with an refractive index operatively equivalent to the refractive indices of the substrate 101 and the substrate 102 is employed to optically couple substrate 101 to substrate 102. A pair of ohmic contacts 106 and 107 are employed to forward bias LED 100 whereby light is generated and emitted from the active p-n junction layer 104 through the substrates 101 and 102 into the surrounding environment.

Figure 21:
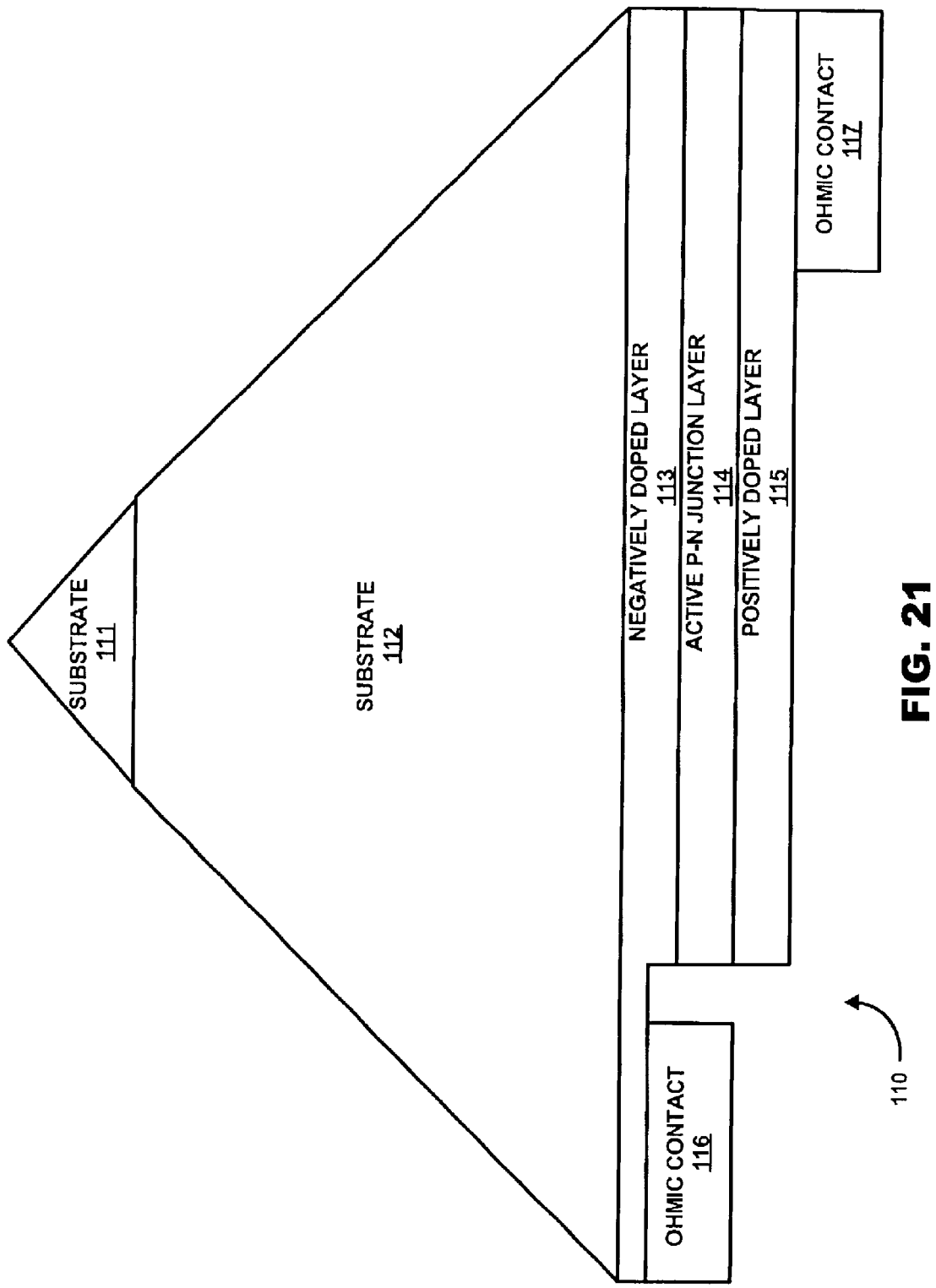

FIG. 21 illustrates a flip-chip LED 110 including an electrically non-conductive transparent substrate 111, an electrically non-conductive transparent substrate 112, a negatively doped layer 113, an active p-n junction layer 114, and a positively doped layer 115. The substrate 111 has an apexed pyramidal shape with a zero (0) degree offset in accordance with substrate 40 (FIG. 3). The substrate 112 has a truncated pyramidal shape with a zero (0) degree offset in accordance with substrate 41 (FIG. 9). An optically clear adhesive (not shown) with an refractive index operatively equivalent to the refractive indices of the substrate 111 and the substrate 112 is employed to optically couple substrate 111 to substrate 112. A pair of ohmic contacts 116 and 117 are employed to forward bias LED 110 whereby light is generated and emitted from the active p-n junction layer 114 through the substrates 111 and 112 into the surrounding environment.

Figure 22:
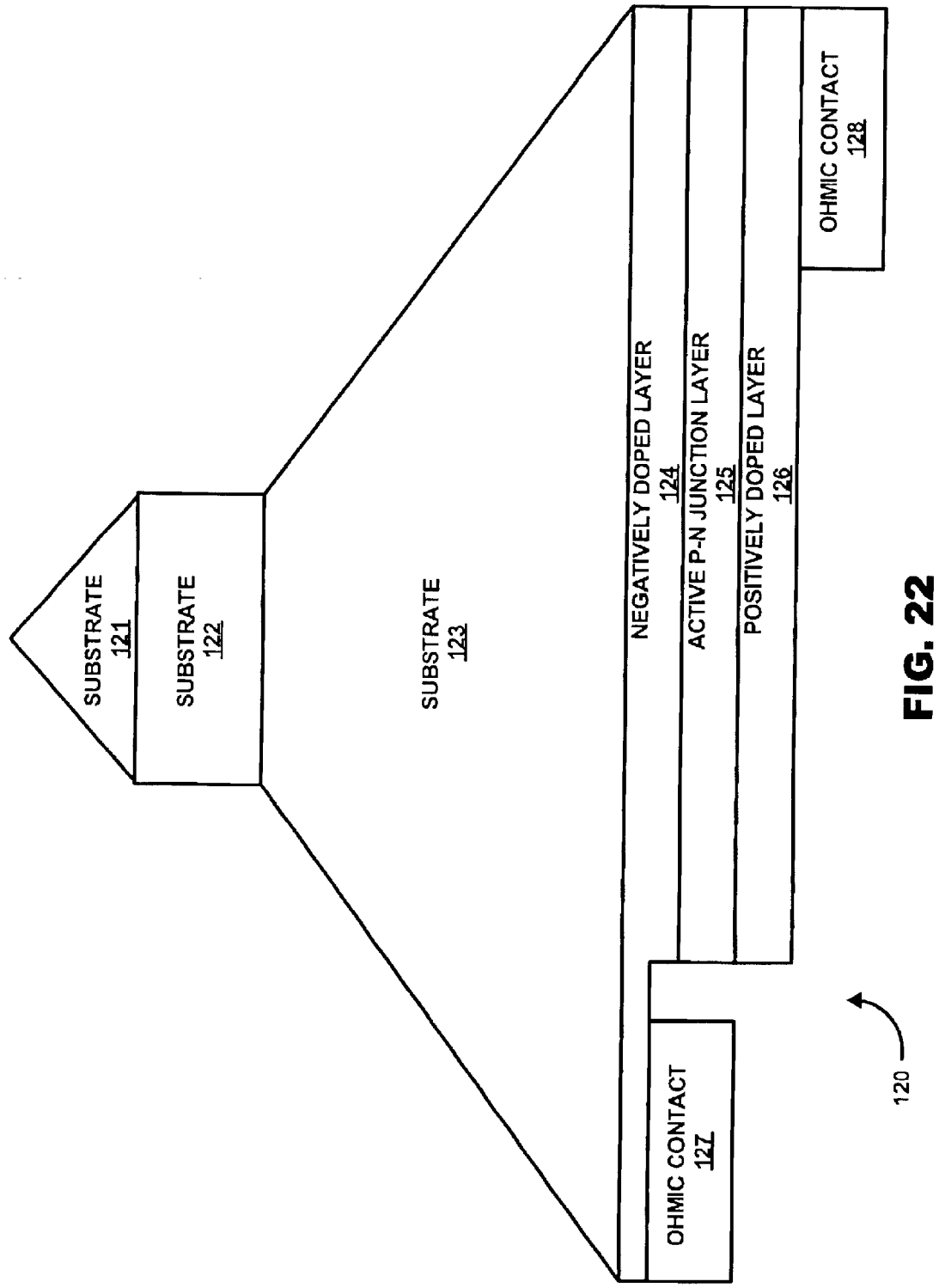

FIG. 22 illustrates a flip-chip LED 120 including an electrically non-conductive transparent substrate 121, an electrically non-conductive transparent substrate 122, an electrically non-conductive transparent substrate 123, a negatively doped layer 124, an active p-n junction layer 125, and a positively doped layer 126. The substrate 121 has an apexed pyramidal shape with a zero (0) degree offset in accordance with substrate 40 (FIG. 3). The substrate 122 has a known cuboidal shape. The substrate 123 has a truncated pyramidal shape with a zero (0) degree offset in accordance with substrate 41 (FIG. 9). An optically clear adhesive (not shown) with an refractive index equivalent to the refractive indices of the substrate 121–123 is employed to optically couple substrate 121 to substrate 122 and to optically couple substrate 122 to substrate 123. A pair of ohmic contacts 127 and 128 are employed to forward bias LED 120 whereby light is generated and emitted from the active p-n junction layer 125 through the substrates 121–123 into the surrounding environment.

Figure 23:
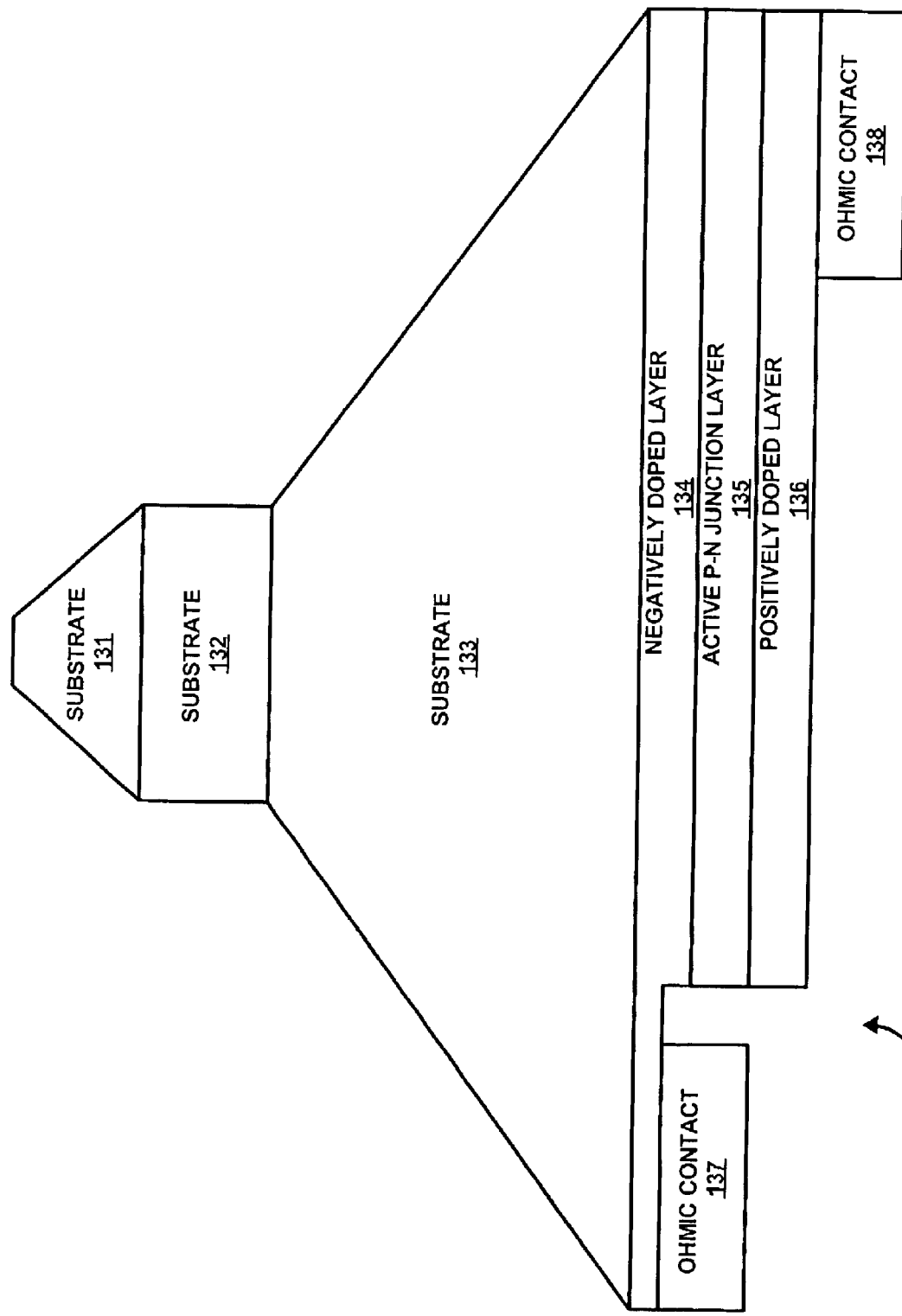

FIG. 23 illustrates a flip-chip LED 130 including an electrically non-conductive transparent substrate 131, an electrically non-conductive transparent substrate 132, an electrically non-conductive transparent substrate 133, a negatively doped layer 134, an active p-n junction layer 135, and a positively doped layer 136. The substrates 131 and 133 have truncated pyramidal shapes with a zero (0) degree offset in accordance with substrate 41 (FIG. 9). The substrate 132 has a known cuboidal shape. An optically clear adhesive (not shown) with an refractive index operatively equivalent to the refractive indices of the substrate 131–133 is employed to optically couple substrate 131 to substrate 132 and to optically couple substrate 132 to substrate 133. A pair of ohmic contacts 137 and 138 are employed to forward bias LED 130 whereby light is generated and emitted from the active p-n junction layer 135 through the substrates 131–133 into the surrounding environment.

From the following description of FIGS. 15–23, those having ordinary skill in the art will appreciate the number of embodiments of a flip-chip LED in accordance with the present invention is essentially limitless.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A semiconductor light-emitting diode of flip-chip design, comprising: a light-emitting region including a negatively doped layer, a positively doped layer, and an active p-n junction layer between said negatively doped layer and said positively doped layer; a transparent substrate overlying said light-light emitting region, said substrate having a pyramidal shape so that said substrate has a cross-sectional area that decreases with distance from said junction and wherein lateral extent of said substrate is bound by lateral extent of a doped layer nearest to the transnarent substrate; and ohmic contacts for forward biasing said junction layer so that at least most of the light is emitted from the junction layer into the surrounding environment is emitted through said substrate.

2. The semiconductor light emitting diode of claim 1, wherein said substrate has a side surface and a bottom surface, and wherein a slope angle of said side surface relative to said bottom surface is within a range of 10–80 degrees.

3. The semicunductor light emitting diode of claim 1, wherein said substrate is composed of electricity non-conductive material.

4. The semiconductor light emitting diode of claim 1, wherein said substrate has a truncated pyramidal shape so as to define a flat top surface through which at least some of said light is emitted into said surrounding environment.

5. The semiconductor light emitting diode of claim 4, wherein said top surface has a center coinciding with a center longitudinal axis of said substrate.

6. A semiconductor light-emitting diode of flip-chip design, comprising: a light-emitting region including a first doped layer, a second doped layer, and an active p-n junction layer between said first doped layer and said second doped layer; and a first transparent substrate adjacent said first doped layer, said first transparent substrate having a pyramidal shape that said substrate has a cross-sectional area that decreases with distance from said junction and wherein lateral extent of said substrate is bound by lateral extent of a doped layer nearest to the transparent substrate; and ohmic contacts for forward biasing said junction layer so that at least most of the light is emitted from the junction layer into the surrounding environment is emitted through said substrate.

7. The semiconductor light emitting diode of claim 6, wherein said first transparent substrate has a side surface and a bottom surface, and wherein a slope angle of said side surface relative to said bottom surface is within a range of 1–80 degrees.

8. A semiconductor light-emitting diode of flip-chip design, comprising: a light-emitting region including a first doped layer, a second doped layer, and an active p-n junction layer between said first doped layer and said second doped layer; and a first transparent substrate adjacent said first doped layer, said first transparent substrate having a pyramidal shape that said substrate has a cross-sectional area that decreases with distance from said junction and wherein lateral extent of said substrate is bound by lateral extent of said first doped layer; and ohmic contacts for forward biasing said junction layer so that at least most of the light is emitted from the junction layer into the surrounding environment is emitted through said substrate; and wherein an upper portion of said first doped layer has a pyramidal shape.

* * * * *